(12) United States Patent
Meyer et al.

(10) Patent No.: US 10,613,132 B2
(45) Date of Patent: Apr. 7, 2020

(54) ARC FAULT DETECTION UNIT

(71) Applicant: Siemens Aktiengesellschaft, Munich (DE)

(72) Inventors: Joerg Meyer, Dresden (DE); Peter Schegner, Dresden (DE); Karsten Wenzlaff, Dresden (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 326 days.

(21) Appl. No.: 15/603,561

(22) Filed: May 24, 2017

(65) Prior Publication Data
US 2017/0343597 A1 Nov. 30, 2017

(30) Foreign Application Priority Data
May 31, 2016 (DE) .................. 10 2016 209 444

(51) Int. Cl.
*G01R 31/02* (2006.01)
*H02H 1/00* (2006.01)
*H02H 3/16* (2006.01)

(52) U.S. Cl.
CPC ......... *G01R 31/025* (2013.01); *G01R 31/024* (2013.01); *H02H 1/0015* (2013.01); *H02H 3/16* (2013.01)

(58) Field of Classification Search
CPC .. G10R 31/025; G10R 31/024; H02H 1/0015; H02H 3/16
See application file for complete search history.

(56) References Cited

U.S. PATENT DOCUMENTS 5,834,940 A 11/1998 Brooks
6,654,219 B1 11/2003 Romano et al.
(Continued)

FOREIGN PATENT DOCUMENTS

CN 102565578 A 7/2012
CN 103635820 A 3/2014
(Continued)

OTHER PUBLICATIONS

Extended European Search Report dated Oct. 27, 2017.
(Continued)

*Primary Examiner* — Scott Bauer
(74) *Attorney, Agent, or Firm* — Harness, Dickey & Pierce, P.L.C.

(57) ABSTRACT

An embodiment relates to an arc fault detection unit for an electrical low-voltage circuit including, connected to an evaluation unit, a voltage sensor assigned to the circuit, for periodically determining electrical voltage values of the circuit; and a current sensor assigned to the circuit, for periodically determining electrical current values. They are embodied such that pairs of a voltage and a current value are determined continuously at a point in time. In each case, a first value pair of a voltage and of a current value is present at a first point in time, a second value pair is present at a second point in time, and a third value pair is present at a third point in time. An arc voltage, which is compared to a threshold value, is calculated from the three value pairs. If the threshold value is exceeded, an arc fault detection signal is output.

31 Claims, 5 Drawing Sheets

(56) References Cited

U.S. PATENT DOCUMENTS

| | | | |
|---|---|---|---|
| 7,366,622 B1* | 4/2008 | Nemir | G01R 31/1272 361/2 |
| 7,627,400 B2 | 12/2009 | Dutoya et al. | |
| 2006/0109009 A1 | 5/2006 | Banke et al. | |
| 2008/0129307 A1 | 6/2008 | Yu et al. | |
| 2011/0019444 A1* | 1/2011 | Dargatz | H02H 1/0015 363/50 |
| 2011/0110006 A1 | 5/2011 | Meyer et al. | |
| 2012/0134058 A1* | 5/2012 | Pamer | G01R 31/1227 361/42 |
| 2013/0187662 A1* | 7/2013 | Davis | G01R 31/024 324/521 |
| 2014/0247066 A1 | 9/2014 | Chaintreuil et al. | |
| 2014/0379283 A1* | 12/2014 | Belhaja | G01R 31/025 702/58 |

FOREIGN PATENT DOCUMENTS

| | | |
|---|---|---|
| CN | 104898008 A | 9/2015 |
| DE | 102004056436 A1 | 6/2006 |
| EP | 2424059 A2 | 2/2012 |
| EP | 2916455 A1 | 9/2015 |
| WO | WO 2009156513 A1 | 12/2009 |

OTHER PUBLICATIONS

Cai, Zhiyuan et al; "New Intelligent Technique of Arc Fault"; Shenyang University of Technology, Shenyang 110870, China; No. 10; DOI: 10.16628; 2014.

Chinese Office Action and English translation thereof dated Jun. 27, 2019.

* cited by examiner

ARC FAULT DETECTION UNIT

PRIORITY STATEMENT

The present application hereby claims priority under 35 U.S.C. § 119 to German patent application number DE 102016209444.0 filed May 31, 2016, the entire contents of which are hereby incorporated herein by reference.

FIELD

At least one embodiment of the invention generally relates to an arc fault detection unit, a circuit breaker, a short circuiter and/or a method for arc fault detection.

BACKGROUND

In low-voltage circuits or low-voltage systems, respectively, or low-voltage mains, respectively, i.e. circuits for voltages of up to 1000 volts of AC voltage or 1500 volts of DC voltage, short circuits are for the most part associated with occurring arc faults, such as parallel or serial arc faults. In particular in high-performance distribution and switching systems, they can lead to disastrous destruction of operating equipment, system parts or complete switching systems, if not turned off sufficiently quickly. To avoid a longer-lasting and large-area failure of the power supply and to reduce bodily harm, it is necessary to detect such arc faults, in particular high-current or parallel arc faults, respectively, within a few milliseconds and to extinguish them. Conventional protective systems of power supply systems (e.g. fuses and circuit breakers) cannot provide reliable protection under the required time requirements.

Here, circuit breaker in particular refers to switches for low voltage. Circuit breakers are typically used, in particular in low-voltage systems, for currents of between 63 and 6300 amps. More specifically, closed circuit breakers, such as molded case circuit breakers, are used for currents of between 63 and 1600 amps, in particular of between 125 and 630 or 1200 amps. Open circuit breakers or air conduction switches, respectively, such as air circuit breakers, are in particular used for currents of between 630 and 6300 amps, more specifically of between 1200 and 6300 amps.

Circuit breakers can in particular have an electronic trip unit, identified in short as ETU.

Circuit breakers monitor the current flowing through them and interrupt the electric current or energy flow, respectively, to an energy sink or a consumer, respectively, which is identified as tripping, when current threshold values or current time span threshold values are exceeded, i.e. when a current value is present for a certain time span. The determination of tripping conditions and the tripping of a circuit breaker can take place by way of an electronic trip unit.

Short circuiters are special devices for short-circuiting lines or bars, respectively, in order to produce defined short circuits for protecting circuits or systems, respectively.

Conventional arc fault detection systems evaluate the light emission created by the arc and hereby detect the arc fault.

SUMMARY

The inventors have recognized that this has the disadvantage that optical waveguides or optical detection systems, respectively, must be installed parallel to the electrical lines or bars, respectively, in order to detect possibly occurring arc faults.

At least one embodiment of the invention shows a possibility for arc fault detection.

At least one embodiment is directed to an arc fault detection unit; at least one embodiment is directed to a circuit breaker; at least one embodiment a short circuiter; and at least one embodiment a method.

According to at least one embodiment of the invention, an arc fault detection unit for an electrical low-voltage circuit includes at least one voltage sensor assigned to the circuit, for periodically determining electrical voltage values of the circuit, at least one current sensor assigned to the circuit, for periodically determining electrical current magnitudes of the circuit. These are connected to an evaluation unit. The sensors can thereby be arranged externally and do not need to be arranged in the housing of the arc fault detection unit. The detection unit is embodied in such a way that value pairs of a voltage value and of a current magnitude are determined continuously at a point in time, for example by scanning the corresponding values, so that in each case a first value pair of a voltage value (u1) and of a current magnitude is present at a first point in time, and a second value pair of a voltage value (u2) and of a current magnitude is present at a second point in time.

According to at least one embodiment of the invention, a circuit breaker for an electrical low-voltage circuit is further provided. This circuit breaker has an arc fault detection unit according to an embodiment of the invention. The arc fault detection unit is connected to the circuit breaker, wherein they are embodied in such a way that the circuit breaker trips, i.e. interrupts the electrical circuit, in response to an arc fault detection signal being output. An extinguishing of the arc fault can thus be attained. If the circuit breaker has an electronic trip unit, a very quick tripping of the circuit breaker can be attained when an arc fault detection signal is present.

According to at least one embodiment of the invention, a short circuiter having an arc fault detection unit, which is connected to the short circuiter, is further provided. They are embodied in such a way that the short circuiter short-circuits the electrical circuit in response to an arc fault detection signal being output in order to effect an extinguishing of the arc fault.

According to at least one embodiment of the invention, a method for arc fault detection for an electrical circuit, in particular low-voltage circuit, is further provided. Electrical voltage values and current values of the circuit are determined periodically herein, so that in each case a first value pair of a voltage (u1) and of a current value (i1) is present at a first point in time and a second value pair of a voltage (u2) and of a current value (i2) is present at a second point in time.

All embodiments and features of the invention, alone as well as in mutual interaction, effect an improvement of the detection of arc faults or the extinguishing thereof, respectively.

The described characteristics, features and advantages of this invention, as well as the way in which they are attained, become clearer and more easily understandable in the context of the following description of the example embodiments, which will be explained in more detail in the context of the drawings.

DETAILED DESCRIPTION OF THE EXAMPLE EMBODIMENTS

Figure 1:
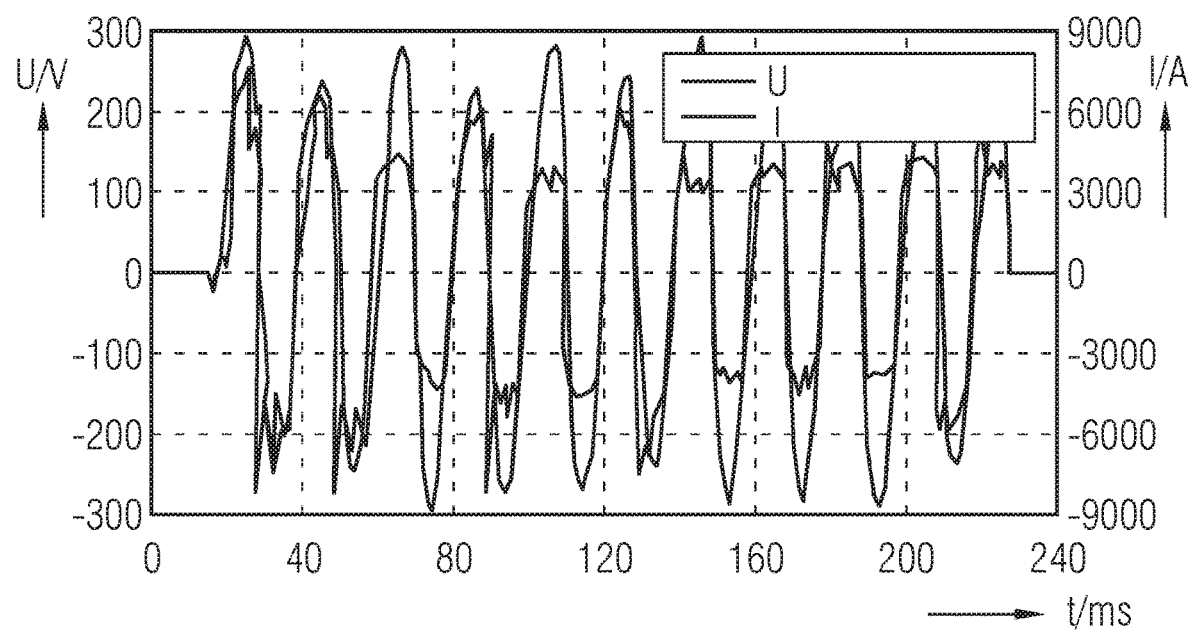
FIG. 1 shows a diagram of the temporal voltage and current curve after arc ignition

In the following, embodiments of the invention are described in detail with reference to the accompanying drawings. It is to be understood that the following description of the embodiments is given only for the purpose of illustration and is not to be taken in a limiting sense. It should be noted that the drawings are to be regarded as being schematic representations only, and elements in the drawings are not necessarily to scale with each other. Rather, the representation of the various elements is chosen such that their function and general purpose become apparent to a person skilled in the art.

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

Various example embodiments will now be described more fully with reference to the accompanying drawings in which only some example embodiments are shown. Specific structural and functional details disclosed herein are merely representative for purposes of describing example embodiments. Example embodiments, however, may be embodied in various different forms, and should not be construed as being limited to only the illustrated embodiments. Rather, the illustrated embodiments are provided as examples so that this disclosure will be thorough and complete, and will fully convey the concepts of this disclosure to those skilled in the art. Accordingly, known processes, elements, and techniques, may not be described with respect to some example embodiments. Unless otherwise noted, like reference characters denote like elements throughout the attached drawings and written description, and thus descriptions will not be repeated. The present invention, however, may be embodied in many alternate forms and should not be construed as limited to only the example embodiments set forth herein.

It will be understood that, although the terms first, second, etc. may be used herein to describe various elements, components, regions, layers, and/or sections, these elements, components, regions, layers, and/or sections, should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items. The phrase "at least one of" has the same meaning as "and/or".

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

Spatial and functional relationships between elements (for example, between modules) are described using various terms, including "connected," "engaged," "interfaced," and "coupled." Unless explicitly described as being "direct," when a relationship between first and second elements is described in the above disclosure, that relationship encompasses a direct relationship where no other intervening elements are present between the first and second elements, and also an indirect relationship where one or more intervening elements are present (either spatially or functionally) between the first and second elements. In contrast, when an element is referred to as being "directly" connected, engaged, interfaced, or coupled to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Also, the term "exemplary" is intended to refer to an example or illustration.

When an element is referred to as being "on," "connected to," "coupled to," or "adjacent to," another element, the element may be directly on, connected to, coupled to, or adjacent to, the other element, or one or more other intervening elements may be present. In contrast, when an element is referred to as being "directly on," "directly connected to," "directly coupled to," or "immediately adjacent to," another element there are no intervening elements present.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Before discussing example embodiments in more detail, it is noted that some example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Specific structural and functional details disclosed herein are merely representative for purposes of describing example embodiments of the present invention. This invention may, however, be embodied in many alternate forms and should not be construed as limited to only the embodiments set forth herein.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

According to at least one embodiment of the invention, an arc fault detection unit for an electrical low-voltage circuit includes at least one voltage sensor assigned to the circuit, for periodically determining electrical voltage values of the circuit, at least one current sensor assigned to the circuit, for periodically determining electrical current magnitudes of the circuit. These are connected to an evaluation unit. The sensors can thereby be arranged externally and do not need to be arranged in the housing of the arc fault detection unit. The detection unit is embodied in such a way that value pairs of a voltage value and of a current magnitude are determined continuously at a point in time, for example by scanning the corresponding values, so that in each case a first value pair of a voltage value (u1) and of a current magnitude is present at a first point in time, and a second value pair of a voltage value (u2) and of a current magnitude is present at a second point in time.

An arc voltage (U1$b$), which is compared to a threshold value (SW), is calculated from the two value pairs.

If the threshold value is exceeded in magnitude, an arc fault detection signal is output.

Exceeding in magnitude refers to an exceeding, in the case of which an exceeding could take place with respect to a positive first threshold value and/or an undershooting could take place with respect to a negative second threshold value, analogous to a comparison by magnitude of the arc voltage to a (positive) threshold value.

This has the particular advantage that a simple and secure possibility for arc fault detection is provided.

Advantageous embodiments of the invention are specified in the claims.

In an advantageous embodiment of the invention, a third value pair of a voltage value (u3) and of a current magnitude at a third point in time is present.

An arc voltage (U1$b$), which is compared to a threshold value (SW), is calculated from the three value pairs. If the threshold value is exceeded in magnitude, an arc fault detection signal is output.

This has the particular advantage that a more accurate and even more secure possibility for arc fault detection is provided.

In an advantageous embodiment of the invention, the electrical current magnitude is either an electrical current value ($i_m$) or a value for the change of the electrical current according to the time ($i'_m$). This has the particular advantage that only one current magnitude, either current value or change of the electrical current according to the time, or the discharge of the current according to the time, respectively, needs to be determined. For example, a Rogowski coil can advantageously be used to determine the current magnitude, whereby the change of the current is determined according to the time.

In an advantageous embodiment of the invention, if the electrical current value ($i_m$) is determined, a value for the change of the electrical current according to the time ($i'_m$) or the first discharge of the current value according to the time, respectively, is determined therefrom or if the value for the change of the electrical current according to the time ($i'_m$) is determined, the electrical current value ($i_m$) is determined therefrom. A value pair thus advantageously has a voltage value ($u_m$), a current value ($i_m$) and a value for the change of the current according to the time ($i'_m$), by which the arc voltage (U1$b$) can be calculated.

In an advantageous embodiment of the invention, the evaluation unit is embodied in such a way that the calculation of the arc voltage (U1$b$) is carried out with the help of a differential equation or the solution thereof.

This has the particular advantage that a comprehensive calculation possibility, which takes many parameters of an actual circuit into account, is available.

In an advantageous embodiment of the invention, the evaluation unit is embodied in such a way that at least one of the following terms is formed for calculating the arc voltage (U1$b$):

a first product (P1), formed from the third voltage value (u3) and the first current value (i1), a second product (P2), formed from the first voltage value (u1) and the third current value (i3), a third product (P3), formed from the first discharge of the second current value according to the time (i'2) and the first current value (i1), a fourth product (P4), formed from the first discharge of the first current value according to the time (i'1) and the second current value (i2), a fifth product (P5), formed from the second voltage value (u2) and the first current value (i1), a sixth product (P6), formed from the first voltage value (u1) and the second current value (i2), a seventh product (P7), formed from the first discharge of the third current value according to the time (i'3) and the first current value (i1), an eighth product (P8), formed from the first discharge of the first current value according to the time (i'1) and the third current value (i3), a first difference (D1), the minuend of which is formed from the product of the sign of the first current value (sgn(i1)) and the second current value (i2) and the subtrahend of which is formed from the product of the sign of the second current value (sgn(i2)) and the first current value (i1), a second difference (D2), the minuend of which is formed from the product of the sign of the first current value (sgn(i1)) and the third current value (i3) and the subtrahend of which is formed from the product of the sign of the third current value (sgn(i3)) and the first current value (i1), a third difference (D3), the minuend of which is the first product (P1) and the subtrahend of which is the second product (P2), a fourth difference (D4), the minuend of which is the third product (P3) and the subtrahend of which is the fourth product (P4), a fifth difference (D5), the minuend of which is the fifth product (P5) and the subtrahend of which is the sixth product (P6), a sixth difference (D6), the minuend of which is the seventh product (P7) and the subtrahend of which is the eighth product (P8), a ninth product (P9), formed from the third difference (D3) and the fourth difference (D4), a tenth product (P10), formed from the fifth difference (D5) and the sixth difference (D6), an eleventh product (P11), formed from the first difference (D1) and the sixth difference (D6), a twelfth product (P12), formed from the second difference (D2) and the fourth difference (D4), a seventh difference (D7), the minuend of which is the ninth product (P9) and the subtrahend of which is the tenth product (P10), and an eighth difference (D8), the minuend of which is the eleventh product (P11) and the subtrahend of which is the twelfth product (P12).

This has the particular advantage that a determination of the arc fault voltage is made possible by way of at least one of these terms.

In an advantageous embodiment of the invention, the evaluation unit is embodied in such a way that the arc voltage (U1b) is a quotient, the dividend of which has the seventh difference (D7) and the divisor of which has the eighth difference (D8).

This has the particular advantage that an exact determination of an arc fault voltage is made possible.

In an advantageous embodiment of the invention, the first point in time is earlier than the second point in time. In the alternative, the second point in time is earlier than the third point in time. In the alternative, the first point in time is earlier than the second point in time and the latter is earlier than the third point in time.

This has the particular advantage that a particularly accurate determination of an arc fault voltage is made possible.

According to at least one embodiment of the invention, a circuit breaker for an electrical low-voltage circuit is further provided. This circuit breaker has an arc fault detection unit according to the an embodiment of invention. The arc fault detection unit is connected to the circuit breaker, wherein they are embodied in such a way that the circuit breaker trips, i.e. interrupts the electrical circuit, in response to an arc fault detection signal being output. An extinguishing of the arc fault can thus be attained. If the circuit breaker has an electronic trip unit, a very quick tripping of the circuit breaker can be attained when an arc fault detection signal is present.

This has the particular advantage that a circuit breaker is expanded by a further, advantageous functionality for the protection of electrical systems. Arc faults are thereby advantageously detected and turned off in one device. If applicable, available assembly groups, such as voltage and/or current sensors, power supply, microprocessors for the evaluation unit, etc. can also be used and can thus achieve synergies.

According to at least one embodiment of the invention, a short circuiter having an arc fault detection unit, which is connected to the short circuiter, is further provided. They are embodied in such a way that the short circuiter short-circuits the electrical circuit in response to an arc fault detection signal being output in order to effect an extinguishing of the arc fault.

This has the particular advantage that a simple, quick and effective possibility for extinguishing arc faults is available.

According to at least one embodiment of the invention, a method for arc fault detection for an electrical circuit, in particular low-voltage circuit, is further provided. Electrical voltage values and current values of the circuit are determined periodically herein, so that in each case a first value pair of a voltage (u1) and of a current value (i1) is present at a first point in time and a second value pair of a voltage (u2) and of a current value (i2) is present at a second point in time.

An arc voltage (U1b), which is compared to a threshold value (SW), is calculated from the two value pairs.

If the threshold value is exceeded, an arc fault detection signal is output.

This has the advantage that a simple possibility for detecting an arc fault is made possible on the basis of two voltage and current value pairs.

In a circuit or mains, respectively, in which an arc fault burns, a current and voltage curve can be measured, which has a significant course. A typical voltage and current curve for an arc fault is illustrated in FIG. 1. FIG. 1 shows an illustration of a diagram, in which the temporal curve of the electrical voltage U and of the electrical current I after ignition of an arc or arc fault, respectively, in particular parallel arc fault, is illustrated in an electrical circuit, in particular low-voltage circuit.

The time t is illustrated on the horizontal X-axis in milliseconds (ms). The magnitude of the electrical voltage U is illustrated on the vertical Y-axis on the left scaling in volts (V). On the right scaling, the magnitude of the electrical current I is illustrated in amps (A).

Electrical voltage values $u_m$ and electrical current values $i_m$ are determined continuously or periodically, respectively, for example by way of one sensor each. For example the electrical current $i_m$ in this case can be measured directly. In the alternative, the change of the current according to the time $i'_m$ can be measured as well. If the electrical current $i_m$ is measured, the change of the current according to the time $i'_m$ can be determined therefrom, for example by differentiation of the current value $i_m$. If the change of the electrical current according to the time $i'_m$ is measured, the electrical current $i_m$ can be determined therefrom, for example by integrating the change of the electrical current according to the time $i'_m$. The measurement of the change of the electrical current according to the time $i'_m$ can take place for example via a Rogowski coil. In the case of sinusoidal flows in the circuit, the integration can be realized particularly easily, because the integral of the sine is a cosine and the integral of the cosine is a sine.

The current value $i_m$ and the change of the current according to the time $i'_m$ can likewise also be measured in parallel, e.g. by way of 2 sensors. A conversion is thus not necessary.

Voltage values $u_m$ and current values $i_m$ or voltage values $u_m$ and values for the change of the electrical current according to the time $i'_m$, respectively, are determined time and again with a time lag, for example a fixed time lag dt. The determination in this case can take place by scanning the values. The scanning frequency or measuring frequency, respectively, in this case should be a multiple of the frequency of the measured alternating quantities. For example in the case of common electricity grids, for example with 50 Hz or 60 Hz, respectively, the measuring frequency could be in the kilohertz range, for example between 1 and 200 kHz, more specifically in the range of between 10 and 40 or 60 kHz, in particular in the range of between 40 and 50 kHz.

For example a voltage value and a current magnitude are therein in each case determined at a point in time, which is in particular relative or specifically identical.

Figure 2:
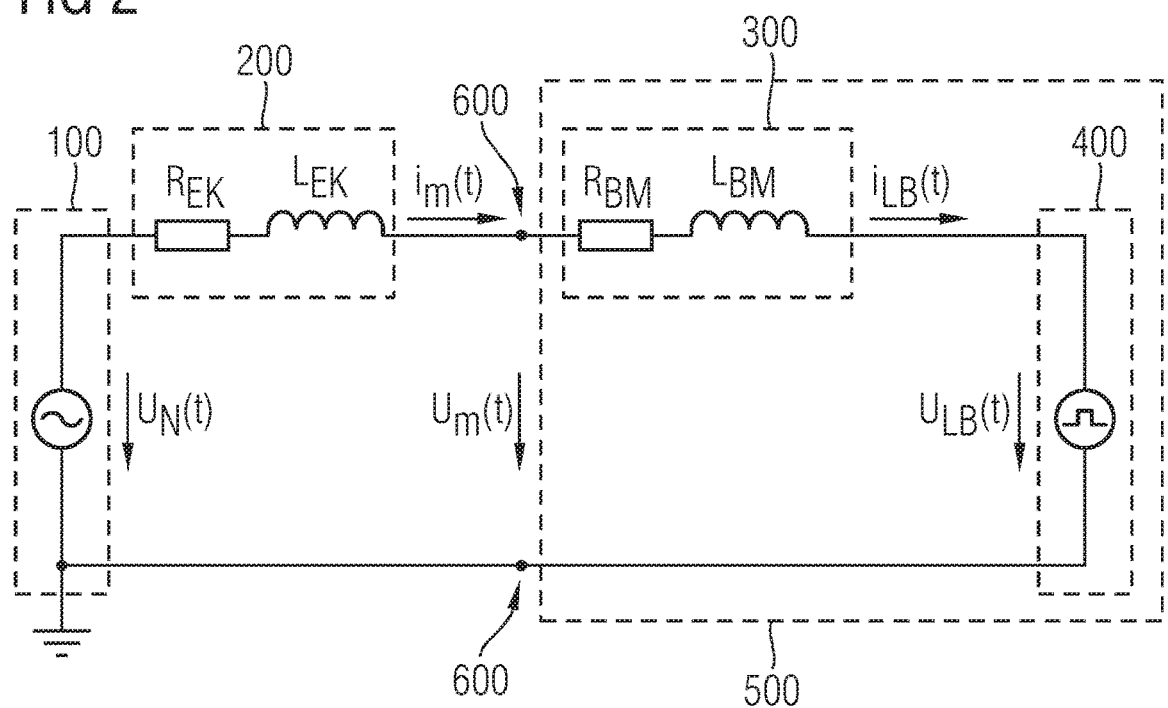
FIG. 2 shows an equivalent circuit diagram of an electrical circuit

FIG. 2 shows an equivalent circuit diagram of an electrical circuit, having an electrical power source 100, which provides an electrical supply voltage $u_n(t)$, a mains access connected thereto or a supply cable 200, illustrated by electrical equivalent circuit elements, such as a supply cable resistor $R_{EK}$ and a supply cable inductor or coil $L_{EK}$, respectively, which is followed by an electrical consumer, operating device or energy sink 300, respectively, illustrated in turn by electrical equivalent circuit elements, such as a consumer resistor $R_{BM}$ and a consumer inductor or coil $L_{BM}$, respectively. An electrical voltage $u_m(t)$ and an electrical current magnitude, such as the electrical current value $i_m(t)$ and/or the change of the current according to the time $i'_m(t)$, or the first discharge of the current according to the time, respectively, can be measured between supply cable 200 and consumer 300. These magnitudes are captured at the measuring points 600, in order to be further processed in the arc fault detection unit.

The area monitored with respect to arc faults is illustrated by a dashed line 500.

An arc fault, which is illustrated by an arc 400 comprising an arc voltage $U_{lb}(t)$, can appear in the electrical circuit. According to an embodiment of the invention, an arc voltage $U_{lb}$ is calculated continuously in the arc fault detection unit with the help of the measured/scanned voltage $u_m(t)$ and the measured/scanned current magnitude (current and/or current change).

According to an embodiment of the invention, the voltage, the current and the change of the current according to the time are used for the calculation. According to an embodiment of the invention, at least two value pairs of these variables must be at hand.

The calculation is carried out in that certain terms (mathematical expressions or equations, respectively), are calculated continuously.

The calculation of these terms is based on a solution of the line equation of the first order:

$$u_m(t) = R_{BM} \cdot i_m(t) + L_{BM} \frac{di_m(t)}{dt} \qquad (1)$$

Under the assumption that an arc fault is present in the low-voltage mains, the electrical behavior would be comparable to that of a counter-voltage source in the mains.

The following, expanded ansatz differential equation results from this:

$$u_m(t) = R_{BM} \cdot i_m(t) + L_{BM} \frac{di_m(t)}{dt} + u_{LB}(t) \qquad (2)$$

The arc fault is illustrated in a simplified manner as a purely ohmic consumer. It is thus assumed that the arc voltage is in-phase with the arc current. The arc voltage can thus be described by way of the following equation:

$$u_{LB}(t) = U_{LS} \cdot \text{sign}(i_{LS}(t)) \qquad (3)$$

If it is assumed that the measuring current $i_m(t)$ corresponds to the arc fault current $i_{LE}(t)$, thus that no current branching is present between measuring location and arc fault lighting point, it can be stated:

$$u_m(t) = R_{BM} \cdot i_m(t) + L_{BM} \frac{di_m(t)}{dt} + \text{sign}(i_m(t)) \cdot U_{LB} \qquad (4)$$

To solve this expanded ansatz differential equation, a differentiating solution method is used according to an embodiment of the invention. The calculation of the arc voltage is carried out according to an embodiment of the invention by transposing and solving the equation (4) to $U_{LE}$.

$$\begin{aligned}u_m(t) &= R_{BM} \cdot i_m(t) + L_{BM} \cdot \frac{di_m(t)}{dt} + U_{LB} \cdot \text{sgn}(i_m(t)) \\ &= R_{BM} \cdot i_m(t) + L_{BM} \cdot i'_m(t) + U_{LB} \cdot \text{sgn}(i_m(t))\end{aligned} \qquad (5)$$

The equation can be simplified in that, according to an embodiment of the invention, individual components or elements of the equation, respectively, are not considered, for example in that only the arc voltage and the ohmic or resistive component, respectively, is considered. In the alternative, for example only the inductive component, inductive plus sign of the current, ohmic plus sign of the current, ohmic and inductive is considered. In its complete form, both the ohmic and inductive component and the sign of the current are considered.

Such a simplification has the particular advantage that a particularly simple determination of the arc voltage is made possible through this and a simple possibility for determining an arc fault is thus at hand.

When not considering all components, the arc voltage and the corresponding component can be calculated by using two different value pairs according to an embodiment of the invention.

For example, the arc voltage in this case can be calculated as follows:

$$U_{LB} = \frac{i_2 \cdot u_1 - i_1 \cdot u_2}{i_2 - i_1} = \frac{P13 - P14}{D9} = \frac{D10}{D9}$$

$$U_{LB} = \frac{i_2 \cdot u_1 - i_1 \cdot u_2}{\text{sgn}(i_1) \cdot i_2 - \text{sgn}(i_2) \cdot i_1} = \frac{P13 - P14}{D1} = \frac{D10}{D1}$$

$$U_{LB} = \frac{i'_2 \cdot u_1 - i'_1 \cdot u_2}{i'_2 - i'_1} = \frac{P15 - P16}{D11} = \frac{D12}{D11}$$

$$U_{LB} = \frac{i'_2 \cdot u_1 - i'_1 \cdot u_2}{\text{sgn}(i_1) \cdot i'_2 - \text{sgn}(i_2) \cdot i'_1} = \frac{P15 - P16}{D13} = \frac{D12}{D13}$$

The arc voltage $U_{LB}$ can be calculated by using three different value pairs according to an embodiment of the invention.

According to an embodiment of the invention, the arc voltage $U_{LB}$ can for example be calculated as follows by way of one of the following formulas:

$$U_{LB} = \frac{(u_3 i_1 - u_1 i_3)(i'_2 i_1 - i'_1 i_2) - (u_2 i_1 - u_1 i_2)(i'_3 i_1 - i'_1 i_3)}{(i_2 - i_1)(i'_3 i_1 - i'_1 i_3) - (i_3 - i_1)(i'_2 i_1 - i'_1 i_2)} \quad (6)$$

$$U_{LB} = \frac{(P1 - P2)(P3 - P4) - (P5 - P6)(P7 - P8)}{(D9)(P7 - P8) - (D14)(P3 - P4)} =$$

$$\frac{D3 * D4 - D5 * D6}{D9 * D6 - D14 * D4}$$

$$U_{LB} = \frac{P9 - P10}{P17 - P18} = \frac{D7}{D15}$$

or:

$$U_{LB} = \frac{(u_3 i_1 - u_1 i_3)(i'_2 i_1 - i'_1 i_2) - (u_2 i_1 - u_1 i_2)(i'_3 i_1 - i'_1 i_3)}{(\text{sgn}(i_1)i_2 - \text{sgn}(i_2)i_1)(i'_3 i_1 - i'_1 i_3) - (\text{sgn}(i_1)i_3 - \text{sgn}(i_3)i_1)(i'_2 i_1 - i'_1 i_2)}$$

wherein $u_1$, $i_1$, $i'_1$ are the voltage, current and current change values of a first value set. The indices apply analogously for the second or third value set, respectively.

The abbreviation sgn represents the signum function or sign function, respectively. This function assigns a number its sign. This is defined as follows:

sgn(x)=+1, if x>0;

sgn(x)=0, if x=0;

sgn(x)=−1, if x<0.

The formula 6 consists of two differences D1, D2, of a plurality of products P1, . . . , P8, which, in turn, form the basis for differences D3 to D6. These, in turn, can be combined to form products P9, . . . , P12. These products form the basis for the two further differences D7, D8, with the help of which the arc voltage can be calculated. Formula 6 can be paraphrased as follows:

$$U_{LB} = \frac{(P1 - P2)(P3 - P4) - (P5 - P6)(P7 - P8)}{(D1)(P7 - P8) - (D2)(P3 - P4)} \quad (7)$$

$$U_{LB} = \frac{D3 * D4 - D5 * D6}{D1 * D6 - D2 * D4} \quad (8)$$

$$U_{LB} = \frac{P9 - P10}{P11 - P12} \quad (9)$$

$$U_{LB} = \frac{D7}{D8} \quad (10)$$

For a secure detection of an arc fault, it is necessary to differentiate the operating case—system without arc fault—from the error case—system with arc fault. The arc fault voltage $U_{LB}$ is calculated by way of an embodiment of the invention at hand. The differentiation between the states: a) arc fault present and b) no arc fault present is made by way of a subsequent threshold value comparison of the determined arc voltage.

Figure 3:
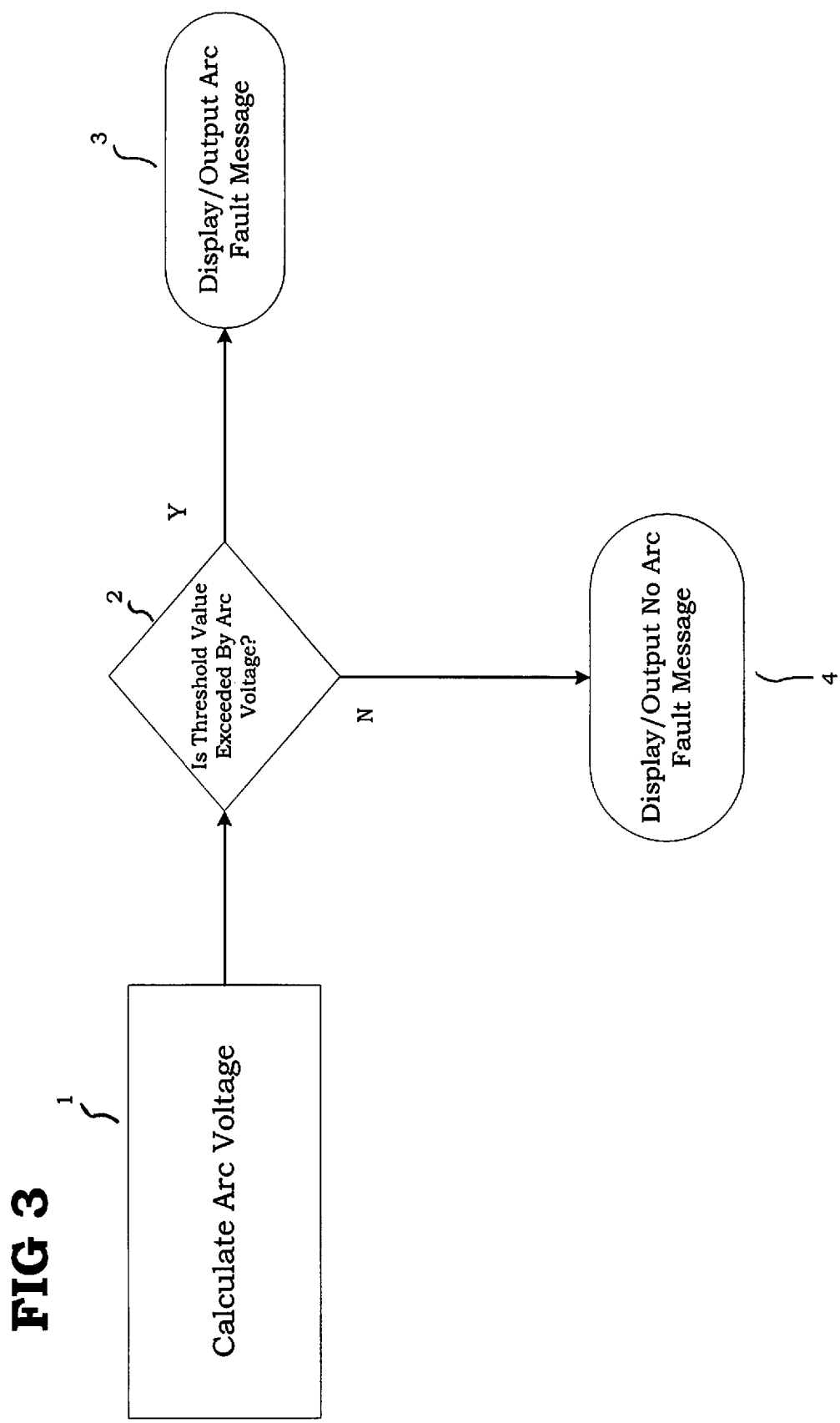
FIG. 3 shows a flow chart for arc fault detection

Such a diagram is illustrated in FIG. 3. In a first step 1, the continuous calculation of the arc voltage takes place.

In a second step 2, this is in each case compared to the threshold value SW.

If the threshold value SW is exceeded, the detection of an arc fault is displayed in a third step 3 and/or an arc fault detection signal is output.

If the threshold value SW has not been exceeded, the message that no arc fault is present can be issued in a fourth step 4.

For example, the threshold value SW or the amount thereof, respectively, can be suitably determined, e.g. at 30 volts.

Based on approximately 10-20 V for the anode-cathode case, the assumption is based on the fact that approximately 10 V are additionally required for the arc column.

In general, the threshold value for an in particular 400 V low-voltage mains can be in the range of between 20 and 300 volts, more specifically in the range of between 20 and 70 volts. In particular, values of between 25 and 50 volts appear to be suitable.

The arc fault detection according to an embodiment of the invention can be combined with further criteria, for example with a further comparison of the magnitude of the electrical current of the circuit. The measured current, in particular the effective value of the measured current, which can be calculated according to the method of Mann-Morrison, for example, is compared in this case to a second threshold value SW2 or current threshold value, respectively, and an arc fault detection signal is output only if this second threshold value SW2 or current threshold value, respectively, is exceeded and the calculated arc voltage exceeds the threshold value SW.

This criterion, identified as overcurrent release, leads to a reliable trouble locating. For the arc fault detection, a minimum arc fault current must flow in the circuit, in order to effect an arc fault detection signal. A value, which is a function of the operating current, can be chosen as threshold value for the overcurrent release. In the alternative, the threshold value determination could also take place in an arc-specific manner, because an arc current of typically 1000 A is present for a burning, for example parallel, low-voltage arc. In the case of serial arcs, far lower currents are present.

That is to say, the second threshold value SW2 can assume every value, for example starting at 1 A, 10 A, 100 A, 1000 A or 5000 A, depending on use or application, respectively.

Figure 4:
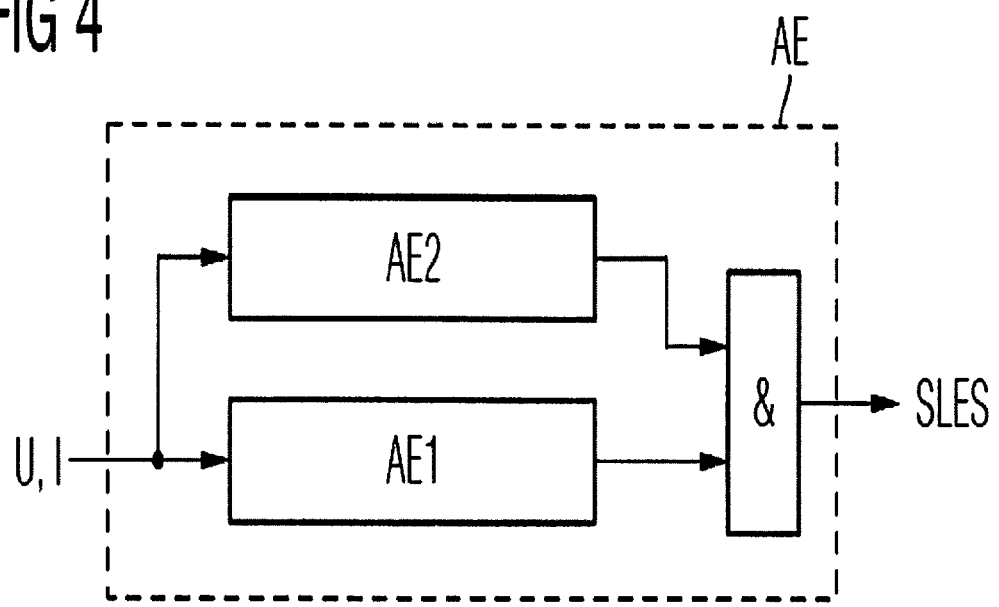
FIG. 4 shows a block circuit diagram of a solution according to an embodiment of the invention

The link between overcurrent release and the arc voltage calculation according to an embodiment of the invention is illustrated in FIG. 4.

FIG. 4 shows an illustration, in the case of which the determined voltage U and the determined current magnitude of the circuit is supplied to a first evaluation unit AE1 for determining the arc voltage.

The determined current magnitude of the circuit is supplied to a second evaluation unit AE2, for checking the current criterion.

The outputs of the two evaluation units AE1, AE2 are linked to an AND-unit &, the output of which outputs an arc fault detection signal SLES when the criteria are fulfilled.

The three evaluation units in this case can be arranged as partial units or subunits, respectively, in one evaluation unit AE.

The output of an arc fault detection signal can furthermore take place only if the arc voltage and/or the current criterion exceeds the corresponding threshold value at least twice. Analogously, exceeding the threshold value three times, four times, five times etc. can also lead to the outputting of an arc fault detection signal. A particularly reliable evaluation and detection of an arc fault is thus attained.

Figure 5:
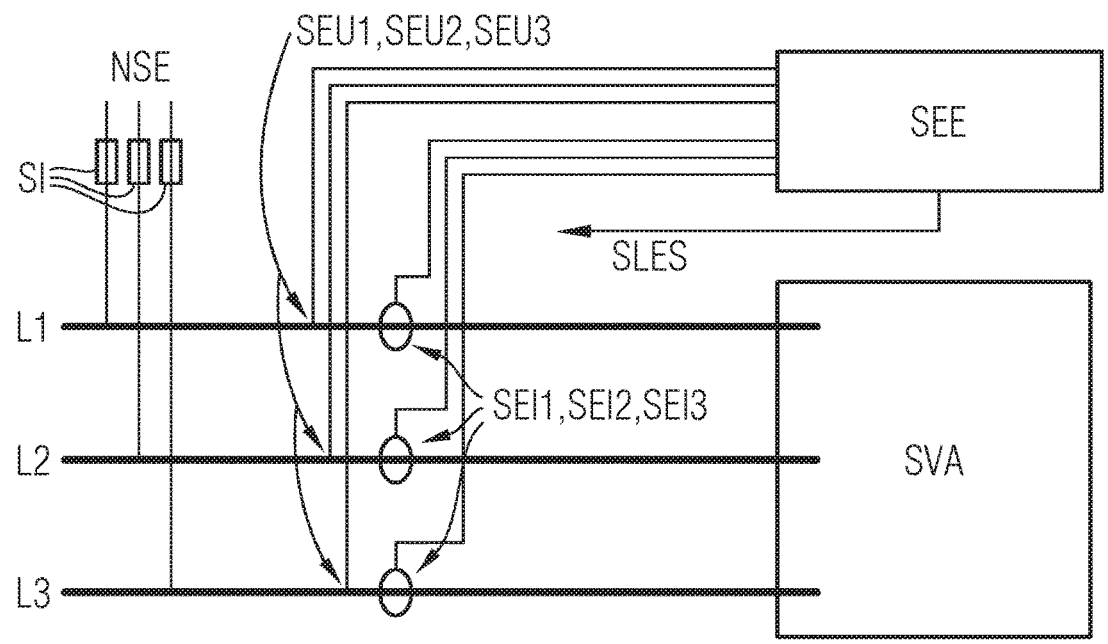
FIG. 5 shows a first illustration for explaining the use of an embodiment of the invention

FIG. 5 shows a schematic illustration of a schematic overview diagram for a system configuration with an output-selective arc fault detection unit for the detection of arc faults. FIG. 5 shows a low-voltage supply NSE, with fuses SI, which are followed by bars or bus bars L1, L2, L3, respectively, for the conductors of a three-phase alternating current system or circuit, respectively. The neutral conductor or zero conductor, respectively, is not illustrated. Each of the three bars L1, L2, L3 is in each case assigned a voltage sensor SEU1, SEU2, SEU3 and a current sensor SEI1, SEI2, SEI3. The bars are connected to a switching and/or distribution system SVA.

The voltage and current sensors are connected to an arc fault detection unit SEE according to an embodiment of the invention, which has an evaluation unit AE according to an embodiment of the invention. The latter has an output for outputting an arc fault detection signal SLES.

The voltage and current sensors determine voltage values and current magnitudes (current value and/or current value change) of the bus bars L1, L2, L3 and guide them to the arc fault detection unit SEE according to an embodiment of the invention.

The sensors are in this case arranged outside of the arc fault detection unit and are connected thereto.

Figure 6:
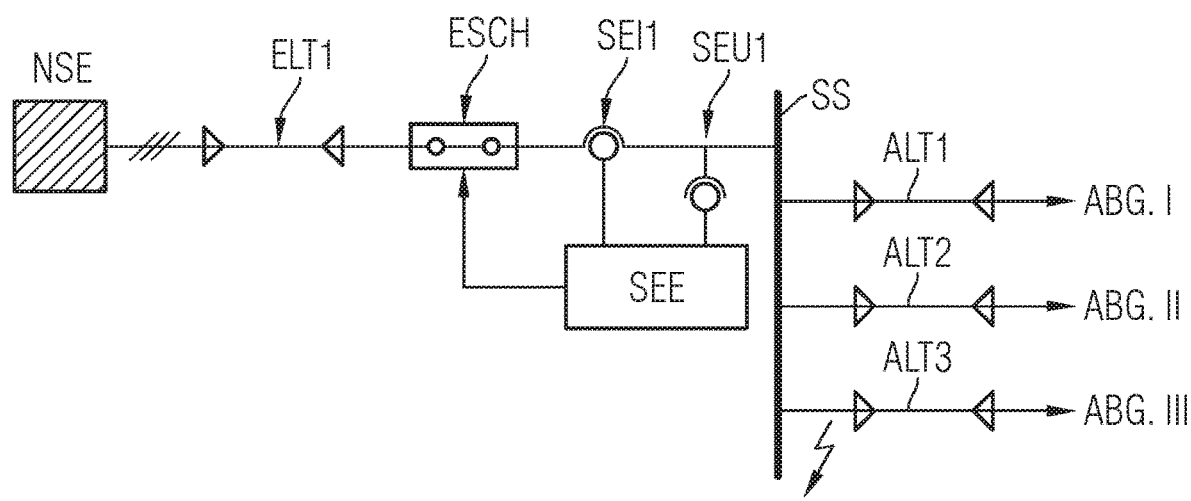
FIG. 6 shows a second illustration for explaining the use of an embodiment of the invention

FIG. 6 shows a further schematic illustration of a schematic overview diagram for a system configuration comprising a central arc fault detection unit for the detection of arc faults. FIG. 6 shows a low-voltage supply NSE, which is followed by a supply cable ELT1, which is followed by a supply switch ESCH, which is followed by a current sensor SEI1 and a voltage sensor SEU1, which is followed by a bus bar SS. 3 outputs ABG I ABG II and ABG III are provided on the bus bar SS. An output cable ALT1, ALT2, ALT3 is in each case assigned thereto.

The sensors SEI1, SEU1 are connected to an arc fault detection unit SEE, the output of which, in turn, is connected to the supply switch ESCH. The supply switch can in this case be a circuit breaker. When detecting an arc fault, the electrical circuit, i.e. the power supply of the bus bar SS, can be interrupted when an arc fault occurs for example in one of the outputs.

Figure 7:
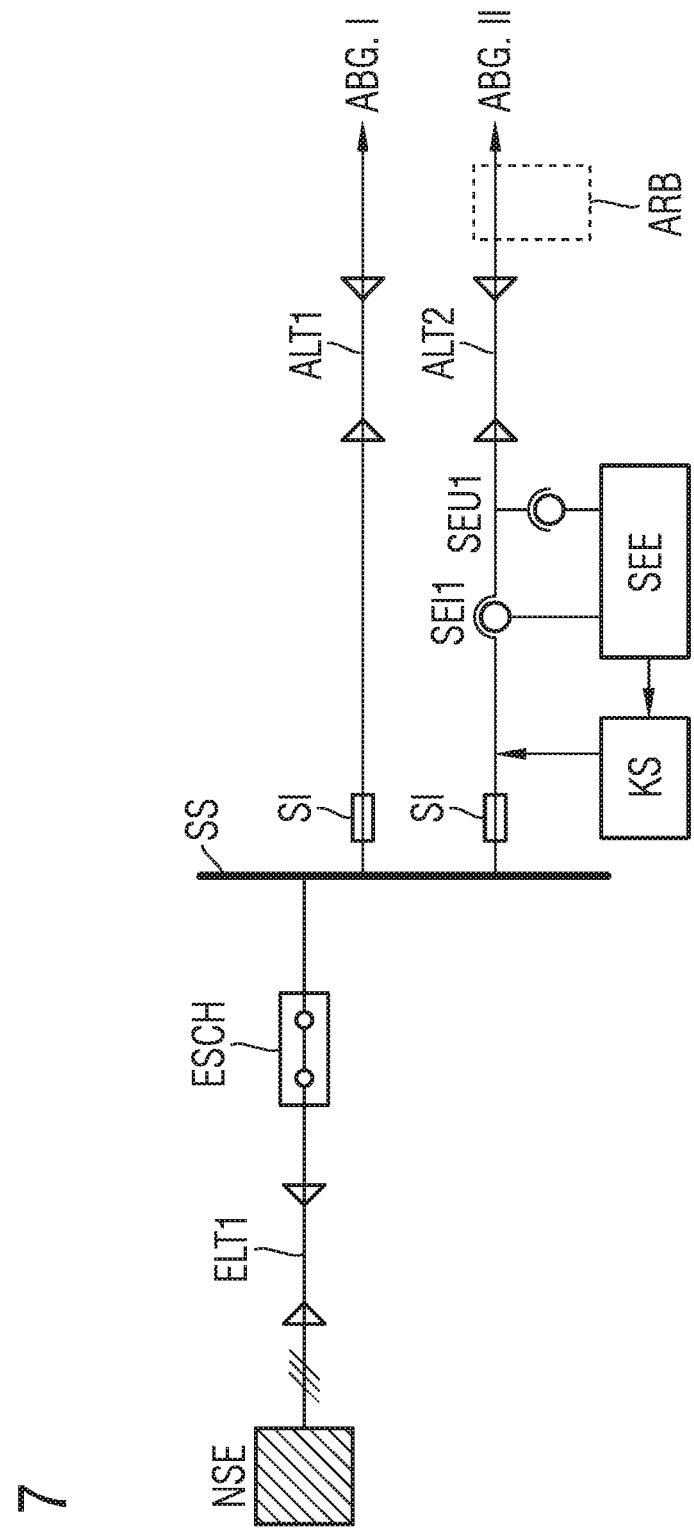
FIG. 7 shows a third illustration for explaining the use of an embodiment of the invention

FIG. 7 shows an illustration according to FIG. 6, with the difference that the sensors are arranged in the second output AGB II, which also has fuses SI and a short circuiter KS. The sensors SEI1 and SEU1 detect current and voltage values of the output ABG II and transfer them to the arc fault detection unit SEE. If the arc fault detection unit SEE detects an arc fault, an arc fault detection signal is output at its output and is transferred to the short circuiter KS. The latter then short-circuits the output ABG II, in order to extinguish the arc fault.

The arc fault detection according to FIG. 6 or 7 can for example be embodied as a mobile system.

Embodiments of the invention will be explained once again below.

Arc faults, in particular parallel or high-energy arc faults can be detected, in particular in low-voltage switching and distribution systems, by way of an embodiment of the invention. According to an embodiment of the invention, in particular a numerical solution or detection algorithm, respectively, on the basis of the evaluation of measured voltage and current values or signals, respectively, is available for this purpose. For detecting arc faults, the voltage and the current or change of the current, respectively, is measured and an arc fault is determined by way of an arc voltage calculation according to an embodiment of the invention. Due to the quick arc detection, which is required in practice, a remarkably quick temporal evaluation can be provided in this way according to an embodiment of the invention.

Arc faults, for example in switch and distribution systems, e.g. with a low-voltage, can be detected quickly by way of an embodiment of this invention, for example on the basis of a central voltage and current measurement on the supply.

An embodiment of the invention can in particular be used in an advantageous manner in, or in interaction with, circuit breakers or short circuiters.

An extensive installation of optical waveguides in systems for arc fault detection is not necessary. The voltage/current measurement can be realized in a central manner and can be used synergetically, if applicable, by further operating device(s).

An implementation in available switching and distribution systems is furthermore easily possible, because a detection system according to an embodiment of the invention can for example be installed only centrally and no installation into individual cells, which are to be protected, is necessary.

An embodiment of the invention can be realized as an assembly group comprising central voltage and current determination.

The detection systems, which are currently established on the market, are based on an optical error detection and thus have the potential for faulty tripping by the impact of extraneous light (e.g. flashlight). In the case of the solution according to an embodiment of the invention on the basis of a voltage and current measurement, this risk potential is not present.

Even though an embodiment of the invention has been illustrated and described in more detail by way of the example embodiment, the invention is not limited by the disclosed examples, and other alternatives can be derived therefrom by a person skilled in the art, without leaving the scope of protection of the invention.

The patent claims of the application are formulation proposals without prejudice for obtaining more extensive patent protection. The applicant reserves the right to claim even further combinations of features previously disclosed only in the description and/or drawings.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

None of the elements recited in the claims are intended to be a means-plus-function element within the meaning of 35 U.S.C. § 112(f) unless an element is expressly recited using the phrase "means for" or, in the case of a method claim, using the phrases "operation for" or "step for."

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

LIST OF REFERENCE NUMERALS

A amps
ABG I output I
ABG II output II
ABG III output III
ALT 1 output cable 1
ALT 2 output cable 2
ALT 3 output cable 3
ARB operating area
AE evaluation unit
AE1 first (partial) evaluation unit
AE2 second (partial) evaluation unit
ELT1 supply cable 1
ESCH supply switch, circuit breaker
I electrical current
$i_{1b}$ arc current
$i_m$ current value, measured
$i'_m$ value of the change of the current value
KS short circuiter
$L_{BM}$ inductor, consumer
$L_{EK}$ inductor, supply cable
L1 bar, conductor 1
L2 bar, conductor 2
L3 bar, conductor 3
ms milliseconds
NSE low-voltage supply
$R_{BM}$ resistor, consumer
$R_{EK}$ resistor, supply cable
SEE arc fault detection unit
SEI1 current sensor
SEI2 current sensor
SEI3 current sensor
SEU1 voltage sensor
SEU2 voltage sensor
SEU3 voltage sensor
SLES arc fault detection signal
SI fuse
SS bus bar
SVA switching and distribution system
SW threshold value arc voltage
SW2 second threshold value current release
t time
U electrical voltage
$U_{1b}$ arc voltage
$u_m$ voltage value, measured
$u_n$ voltage value, power source/mains
V volts
& AND unit
1 step 1—continuous calculation arc voltage
2 step 2—threshold value comparison
3 step 3—output arc fault detection signal
4 step 4—no arc fault
100 power source
200 mains access/supply cable
300 consumer/operating device(s)/energy sink
400 arc
500 monitored area
600 measuring points

What is claimed is:

1. An arc fault detection unit for an electrical low-voltage circuit, comprising:
at least one voltage sensor assigned to the electrical low-voltage circuit, to periodically determine electrical voltage values of the electrical low-voltage circuit; and
at least one current sensor assigned to the electrical low-voltage circuit, for periodically determining electrical current magnitudes of the electrical low-voltage circuit, the at least one voltage sensor and the at least one current sensor being connected to an evaluation unit and being embodied such that value pairs of a respective voltage value from the at least one voltage sensor and a current magnitude of a respective at least one current sensor are determined continuously at a point in time, such that
a first value pair of a respective voltage value and a respective current magnitude are present at a respective first point in time, and a second value pair of a respective voltage value and a respective current magnitude is present at a respective second point in time, and
an arc voltage, comparable to a threshold value, is calculatable from the first value pair and the second value pairs and in response to the threshold value being exceeded in magnitude, an arc fault detection signal is output, wherein the evaluation unit is embodied such that calculation of the arc voltage from the first value pair and the second value pair is carried out using a differential equation or a solution of the differential equation.

2. The arc fault detection unit of claim 1, wherein a third value pair of a respective voltage value and of a respective current magnitude at a respective third point in time is present, and wherein an arc voltage, comparable to a threshold value, is calculatable from the first, second and third value pairs and in response to the threshold value being exceeded in magnitude, an arc fault detection signal is output.

3. The arc fault detection unit of claim 1, wherein at least one of an electrical current value and a value for a change of the electrical current in a time period is determined as at least one of the electrical current magnitudes.

4. The arc fault detection unit of claim 3, wherein, in response to the electrical current value being determined, a value for a change of the electrical current in a time period is determined therefrom or, upon the value for the change of the electrical current in the time period being determined, the electrical current value is determined so that the value pair includes a voltage value, a current value and a value for the change of the electrical current in the time period.

5. The arc fault detection unit of claim 1, wherein at least one of the following terms is formed for calculating the arc voltage:
- a thirteenth product, formed from a second respective current value and a first voltage respective value,
- a fourteenth product, formed from a first respective current value and a second respective voltage value,
- a ninth difference, a minuend of the ninth difference being the second respective current value and a subtrahend of the ninth difference being the first respective current value, and
- a tenth difference, a minuend of the tenth difference being the thirteenth product and a subtrahend of the tenth difference being the fourteenth product.

6. The arc fault detection unit of claim 5, wherein the arc voltage is a quotient, a dividend of the quotient including terms of the tenth difference and a divisor of the quotient including terms of the ninth difference.

7. The arc fault detection unit of claim 1, wherein at least one of the following terms is formed for calculating the arc voltage:
- a first product, formed from a third respective voltage value and a first respective current value,
- a second product, formed from a first respective voltage value and a third respective current value,
- a third product, formed from a value of a change of a second respective current value over a time period and a first respective current value,
- a fourth product, formed from a value of change of the first respective current value over a time period and the second respective current value,
- a fifth product, formed from a second respective voltage value and the first respective current value,
- a sixth product, formed from the first respective voltage value and the second respective current value,
- a seventh product, formed from a value of a change of the third respective current value over a time period and the first respective current value,
- an eighth product, formed from the value of the change of the first respective current value over a time period and the third respective current value,
- a first difference, a minuend of the first difference being formed from a product of a sign of the first respective current value and the second respective current value and a subtrahend of the first difference being formed from a product of a sign of the second respective current value and the respective first current value, and
- a second difference, a minuend of the second difference being formed from a product of a sign of the first respective current value and the third respective current value and a subtrahend of which is formed from a product of a sign of the third respective current value and the first respective current value.

8. The arc fault detection unit of claim 7, wherein the arc voltage is a quotient, a dividend of the quotient including terms of a tenth difference and a divisor of the quotient including terms of the first difference.

9. The arc fault detection unit of claim 1, wherein at least one of the following terms is formed for calculating the arc voltage:
- a fifteenth product, formed from the value of a change of a second respective current value and a first respective voltage value over a time period,
- a sixteenth product, formed from the value of a change of a first respective current value and a second respective voltage value over a time period,
- an eleventh difference, a minuend of the eleventh difference being a value of the change of the second respective current value over a time period and a subtrahend of the eleventh difference being a value of a change of the first respective current value over a time period, and
- a twelfth difference, a minuend of the twelfth difference being the fifteenth product and a subtrahend of the twelfth difference being the sixteenth product.

10. The arc fault detection unit of claim 9, wherein the arc voltage is a quotient, a dividend of the quotient including terms of the twelfth difference and a divisor of the quotient including terms of the eleventh difference.

11. The arc fault detection unit of claim 10, wherein the following term is formed for calculating the arc voltage:
- a thirteenth difference, a minuend of the thirteenth difference being formed from a product of a sign of the respective first current value and a value of a change of the second respective current value and a subtrahend of the thirteenth difference being formed from a product of a sign of the second respective current value and a value of a change of the first respective current value.

12. The arc fault detection unit of claim 11, wherein the arc voltage is a quotient, a dividend of the quotient including terms of the twelfth difference and a divisor of the quotient including terms of the thirteenth difference.

13. The arc fault detection unit of claim 7, wherein at least one of the following terms is formed for calculating the arc voltage:
- a third difference, a minuend of the third difference being the first product and a subtrahend of the third difference being the second product,
- a fourth difference, a minuend of the fourth difference being the third product and a subtrahend of the fourth difference being the fourth product,
- a fifth difference, a minuend of the fifth difference being the fifth product and a subtrahend of the fifth difference being the sixth product, and
- a sixth difference, a minuend of the sixth difference being the seventh product and a subtrahend of the sixth difference being the eighth product.

14. The arc fault detection unit of claim 13, wherein at least one of the following terms is formed for calculating the arc voltage:
- a ninth product, formed from the third difference and the fourth difference,
- a tenth product, formed from the fifth difference and the sixth difference,
- an eleventh product, formed from the first difference and the sixth difference, and
- a twelfth product, formed from the second difference and the fourth difference.

15. The arc fault detection unit of claim 14, wherein at least one of the following terms is formed for calculating the arc voltage:
- a seventh difference, a minuend of the seventh difference being the ninth product and a subtrahend of the seventh difference being the tenth product, and
- an eighth difference, a minuend of the eighth difference being the eleventh product and a subtrahend of the eighth difference being the twelfth product.

16. The arc fault detection unit of claim 15, wherein the arc voltage is a quotient, a dividend of the quotient including terms of the seventh difference and a divisor of the quotient including terms of the eighth difference.

17. The arc fault detection unit of claim 16, wherein at least one of the following terms is formed for calculating the arc voltage:

a fourteenth difference, a minuend of the fourteenth difference being the third respective current value and a subtrahend of the fourteenth difference being the first respective current value, a seventeenth product, formed from a ninth difference and the sixth difference, an eighteenth product, formed from the fourteenth difference and the fourth difference, and a fifteenth difference, a minuend of the fifteenth difference being the seventeenth product and a subtrahend of the fifteenth difference being the eighteenth product.

18. An arc fault detection unit of claim 17, wherein the arc voltage is a quotient, the dividend of the quotient including terms of the seventh difference and the divisor of the quotient including terms of the fifteenth difference.

19. The arc fault detection unit of claim 2, wherein
the respective first point in time is relatively earlier than the respective second point in time or
the respective second point in time is relatively earlier than the respective third point in time or
the respective first point in time is relatively earlier than the respective second point in time and the respective second point is relatively earlier than the third point in time.

20. The arc fault detection unit of claim 1, wherein the evaluation unit is embodied such that an arc fault detection signal is output only if the current magnitude exceeds a second threshold value.

21. A circuit breaker, comprising:
the arc fault detection unit of claim 1, connected to the circuit breaker and embodied such that the electrical low-voltage circuit is interruptable by the circuit breaker in response to the output of an arc fault detection signal.

22. A short circuiter, comprising:
the arc fault detection unit of claim 1, connected to the short circuiter and embodied such that the electrical low-voltage circuit is short-circuitable by the short circuiter in response to the output of an arc fault detection signal in order to effect an extinguishing of the arc fault.

23. The arc fault detection unit of claim 2, wherein at least one of an electrical current value and a value for a change of the electrical current in a time period is determined as electrical current magnitude.

24. The arc fault detection unit of claim 2, wherein at least one of the following terms is formed for calculating the arc voltage:
a thirteenth product, formed from a second respective current value and a first voltage respective value,
a fourteenth product, formed from a first respective current value and a second respective voltage value,
a ninth difference, a minuend of the ninth difference being the second respective current value and a subtrahend of the ninth difference being the first respective current value, and
a tenth difference, a minuend of the tenth difference being the thirteenth product and a subtrahend of the tenth difference being the fourteenth product.

25. The arc fault detection unit of claim 24, wherein the arc voltage is a quotient, a dividend of the quotient including terms of the tenth difference and a divisor of the quotient including terms of the ninth difference.

26. A circuit breaker, comprising:
the arc fault detection unit of claim 2, connected to the circuit breaker and embodied such that the electrical low-voltage circuit is interruptable by the circuit breaker in response to the output of an arc fault detection signal.

27. A short circuiter, comprising:
the arc fault detection unit of claim 2, connected to the short circuiter and embodied such that the electrical low-voltage circuit is short-circuitable by the short circuiter in response to the output of an arc fault detection signal in order to effect an extinguishing of the arc fault.

28. A circuit breaker, comprising:
the arc fault detection unit of claim 7, connected to the circuit breaker and embodied such that the electrical low-voltage circuit is interruptable by the circuit breaker in response to the output of an arc fault detection signal.

29. A short circuiter, comprising:
the arc fault detection unit of claim 7, connected to the short circuiter and embodied such that the electrical low-voltage circuit is short-circuitable by the short circuiter in response to the output of an arc fault detection signal in order to effect an extinguishing of the arc fault.

30. A method for arc fault detection for an electrical low-voltage circuit, comprising:
determining electrical voltage values and current magnitudes of the circuit periodically, such that in each case
a first value pair of one of the electrical voltage values and one of the current magnitudes is present at a first point in time, and
a second value pair of one of the electrical voltage values and one of the current magnitudes is present at a second point in time;
calculating an arc voltage, comparable to a threshold value, from the first value pair and the second value pairs; and
outputting, upon the arc voltage exceeding the threshold value, an arc fault detection signal, wherein the arc voltage is calculated from the first value pair and the second value pair using a differential equation or a solution of the differential equation.

31. A method for arc fault detection for an electrical low-voltage circuit, comprising:
determining electrical voltage values and current magnitudes of the circuit periodically, such that in each case
a first value pair of one of the electrical voltage values and one of the current magnitudes is present at a first point in time, and
a second value pair of one of the electrical voltage values and one of the current magnitudes is present at a second point in time;
comparing an arc voltage, determined from the first value pair and the second value pairs, to a threshold value; and
outputting, in response to the comparing indicating the arc voltage exceeds the threshold value, an arc fault detection signal, wherein the arc voltage is determined from the first value pair and the second value pair using a differential equation or a solution of the differential equation.

* * * * *